(12) United States Patent
Masterton et al.

(10) Patent No.: US 6,445,588 B1
(45) Date of Patent: Sep. 3, 2002

(54) APPARATUS AND METHOD FOR SECURING A PRINTED CIRCUIT BOARD TO A BASE PLATE

(75) Inventors: Patrick J. Masterton, Carol Stream, IL (US); Thomas Beise, Hoffman Estates, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/753,158

(22) Filed: Jan. 2, 2001

(51) Int. Cl.$^7$ ................................................. H05K 7/12
(52) U.S. Cl. ........................ 361/759; 361/704; 361/752; 361/759; 361/801; 174/138 G; 220/4.02; 248/560
(58) Field of Search ................................ 361/704, 707, 361/710, 752, 753, 759, 801; 257/717, 718, 719, 727; 220/4.02; 174/138 G; 248/560–562

(56) References Cited

U.S. PATENT DOCUMENTS

| | | | |
|---|---|---|---|
| 4,069,497 A | 1/1978 | Steidlitz | |
| 4,167,031 A | 9/1979 | Patel | |
| 4,218,695 A | 8/1980 | Egerbacher et al. | |
| 4,321,423 A | 3/1982 | Johnson et al. | |
| 4,475,145 A | 10/1984 | Heil et al. | |
| 4,563,725 A | 1/1986 | Kirby | |
| 4,674,005 A | 6/1987 | Lacz | |
| 4,739,447 A | 4/1988 | Lecomte | |
| 4,872,089 A | 10/1989 | Ocken et al. | |
| 5,010,949 A * | 4/1991 | Dehaine | 165/185 |
| 5,031,028 A | 7/1991 | Galich et al. | |
| 5,256,902 A | 10/1993 | Culver et al. | |
| 5,307,236 A | 4/1994 | Rio et al. | |
| 5,344,795 A | 9/1994 | Hashemi et al. | |
| 5,463,529 A | 10/1995 | Chia et al. | |
| 5,552,961 A * | 9/1996 | Van Gaal et al. | 165/104.21 |
| 5,671,123 A * | 9/1997 | Omori et al. | 361/212 |
| 5,713,690 A | 2/1998 | Corbin, Jr. et al. | |
| 5,771,154 A | 6/1998 | Goodman et al. | |
| 5,779,134 A | 7/1998 | Watson et al. | |
| 5,786,365 A | 7/1998 | Alcoe et al. | |
| 5,829,512 A | 11/1998 | August | |
| 5,892,279 A | 4/1999 | Nguyen | |
| 6,058,024 A * | 5/2000 | Lyford | 174/35 R |

* cited by examiner

Primary Examiner—Jayprakash N. Gandhi
(74) Attorney, Agent, or Firm—Jeffrey K. Jacobs

(57) ABSTRACT

A PC board assembly employs an apparatus and method for securing a PC board to a base plate. Multiple compression force distributors are each attached at one end to the PC board. Each compression force distributor is preferably implemented as a compressible standoff that includes two end portions and a compressible body portion. The compressible body portion transfers a compression force applied to one end portion to the other end portion for application to the PC board. The PC board is positioned upon the base plate and the compression force is applied to the standoffs. During application of the compression force, the compressible body portions of the standoffs compress in only one direction toward the base plate, thereby distributing the compression force to the PC board to secure the board to the base plate. The method and apparatus may also be used to secure electrical components to the base plate.

22 Claims, 5 Drawing Sheets

APPARATUS AND METHOD FOR SECURING A PRINTED CIRCUIT BOARD TO A BASE PLATE

FIELD OF THE INVENTION

The invention relates generally to printed circuit board assemblies and, in particular to, an apparatus and method for securing a printed circuit board and/or electrical components attached to the printed circuit board to a base plate without the use of screws or clips.

BACKGROUND OF THE INVENTION

Printed circuit (PC) board assemblies are known. Such assemblies typically include a housing and a PC board populated with electrical components. The housing typically includes a base plate, side walls, and a cover. Depending on the circuitry attached to the PC board, the PC board may be secured to the base plate by clips, clamps, snap-fit mechanisms, glue, epoxy, solder, or screws. For example, PC boards that include circuitry with low power dissipation (e.g., PC boards that do not require attachment to a heat sink) are typically secured to the base plate or bottom of the housing using clips, snap-fit mechanisms, or other techniques that do not involve the use of screws. On the other hand, PC boards that include circuitry with high power dissipation (i.e., PC boards that require attachment to a base plate of a heat sink) are typically secured to the base plate with screws. In certain applications, some electrical components that are attached to the PC board must also be secured to the base plate for power dissipation purposes. For example, in power amplifier applications, the power transistors are typically secured to the heat sink with screws in order to insure sufficient heat transfer away from the transistor during operation. Failure to provide a high thermal conductivity path between the power transistor and the heat sink could result in transistor failure during operation.

Although screws are commonly used to attach PC boards and other electrical components to heat sink base plates in high power applications, the use of screws has many drawbacks. For example, screws require manual insertion and, therefore, are subject to human errors, such as omitted screws, stripped screw heads, and damaged electrical components due to slippage of the hand screw driver or electric torque driver off of the screw head. In addition, the use of screws requires tooling of each heat sink base plate to accommodate the screws. Thus, in most cases, each high power PC board design requires a unique heat sink base plate because PC board designs do not typically utilize the same base plate screw hole placements. Unique heat sink base plates add undesired costs to PC board assemblies.

Therefore, a need exists for an apparatus and method for securing a printed circuit board and/or electrical components attached to the printed circuit board to a base plate that may be used in high power dissipation applications and do not require the use of screws.

DETAILED DESCRIPTION OF A PREFERRED EMBODIMENT

Generally, the present invention encompasses an apparatus and method for securing a printed circuit (PC) board and/or electrical components to a base plate. Multiple compression force distributors are attached to the PC board and/or the electrical components through an attachment technique, such as soldering. Each compression force distributor is preferably implemented as a compressible standoff that includes two end portions and a compressible body portion. A first end portion of the standoff includes a substantially planar outer surface for contacting a source of a compression force, such as a PC board assembly cover. A second end portion of the standoff includes a substantially planar outer surface for contacting the PC board and/or an electrical component. The compressible body portion transfers the compression force applied to the first end portion to the second end portion for application to the PC board and/or the electrical component. The PC board and/or the electrical components are positioned upon the base plate and the compression force is applied to the standoffs. During application of the compression force, the compressible body portions of the standoffs compress in only one direction toward the base plate, thereby distributing the compression force to the PC board and/or the electrical components to secure the PC board and/or the electrical components to the base plate.

By using compressible standoffs or similar devices to secure a PC board and/or an electrical component to a base plate in this manner, the present invention eliminates the use of screws to provide such attachment as in the prior art, without jeopardizing thermal reliability of a PC board assembly that includes the PC board, high power dissipation electrical components and the compressible standoffs. In addition, the present invention accommodates the use of an automated pick-and-place machine to automatically position the standoffs in their proper locations on the PC board and/or the electrical components, thereby limiting manual operations to merely arranging the base plate, the populated and reflowed PC board, and the PC board assembly cover. Further, since the standoffs preferably compress toward the base plate only, without increasing in size in any other direction, the standoffs are designed to minimize any negative impact on the electrical components or other circuitry that may be adjacent to the standoffs. Still further, by preferably using a PC board assembly cover as the source of the compression force, a PC board assembly that includes the cover, the compressible standoffs, and the base plate is a self-securing, reliable system.

Figure 1:
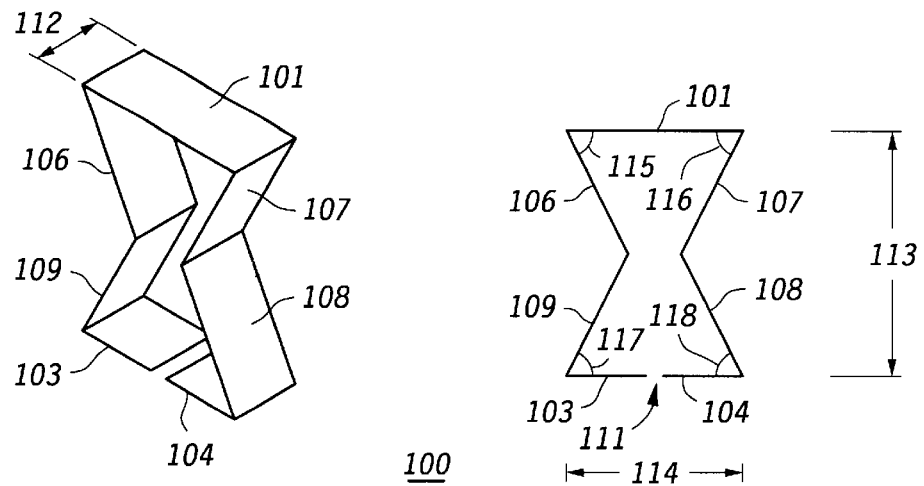
FIG. 1 illustrates perspective and side views of a compressible standoff in accordance with a preferred embodiment of the present invention.

The present invention can be more fully understood with reference to FIGS. 1–8, in which like reference numerals designate like items. FIG. 1 illustrates perspective and side views of a compressible standoff 100 in accordance with a preferred embodiment of the present invention. The compressible standoff 100 includes a substantially planar top end portion 101, a substantially planar bottom end portion formed by two bottom end subportions 103, 104, and four angled body members 106–109. The compressible standoff 100 is preferably fabricated as an integrated device from a length of solderable material having high elasticity when formed substantially as illustrated in the FIG. The solderable material is preferably a copper alloy, such as beryllium copper, although other materials may be used. The length of solderable material is formed in accordance with known techniques to substantially coincide with the shape of the standoff 100 depicted in FIG. 1.

When the standoff 100 is an integrated device formed from a length of material, the bottom end portion of the standoff 100 preferably includes two subportions 103, 104 separated by a gap 111. The gap 111 is preferably less than one (1) millimeter and, in the preferred embodiment, is filled with solder, epoxy or some other adhesive used to attach the standoff 100 to a PC board or an electrical component as discussed in more detail below. The surface area of the outer surface of the top portion 101 of the standoff 100 is preferably sufficient to enable a vacuum head of an automated pick-and-place machine to retrieve the standoff 100 from a tape and reel attached to the pick-and-place machine and position the standoff 100 onto a solder pad or other receptacle area of a PC board or an electrical component without the standoff 100 having a tendency to fall from the vacuum head. In addition, the outer surface of the top portion 101 of the standoff 100 is preferably substantially planar to facilitate optimum retention by the vacuum head of the automated pick-and-place machine and to facilitate maximum contact with a source of a compression force to be applied to the top portion 101 during operation of the standoff 100. Operation of the standoff 100 is described in detail below with respect to FIGS. 4–7. In one tested embodiment of the standoff 100, the length of material forming the standoff 100 had a width 112 of approximately three and one-quarter (3.25) millimeters, although a width 112 of at least four (4) millimeters is preferred for the top portion 101 of the standoff 100 for the vacuum retention and compression force contact reasons indicated above. The height 113 and width 114 of the standoff 100 will vary with the particular application, but one tested embodiment of the standoff 100 had a height 113 of approximately twelve and three-quarter (12.75) millimeters, and a width 114 of approximately six and one-half (6.5) millimeters. Consequently, the outer surface of the top portion 101 of the tested embodiment of the standoff 100 had a surface area of approximately twenty-one (21) square millimeters.

The angled body members 106–109 are preferably configured in a shape similar to an hourglass as depicted in FIG. 1. That is, one end of angled body member 106 is connected to one end of the top end portion 101, such that angled body member 106 forms an acute angle 115 with the top end portion 101. The other end of angled body member 106 is connected to one end of angled body member 109. The other end of angled body member 109 is connected to one end of the bottom end portion (i.e., the non-gap end of bottom end subportion 103), such that angled body member 109 forms an acute angle 117 with the bottom end portion. Angled body member 107 is connected at one end to the other end of the top end portion 101, such that angled body member 107 forms an acute angle 116 with the top end portion 101. The other end of angled body member 107 is connected to one end of angled body member 108. The other end of angled body member 108 is connected to the other end of the bottom end portion (i.e., the non-gap end of bottom end subportion 104), such that angled body member 108 forms an acute angle 118 with the bottom end portion. Although the connections of the angled body members 106–109 with each other and with the end portions 101, 103, 104 are shown to be without a smooth radius, such connections preferably include a smooth radius or curve to reduce the likelihood that the connections will crack as the standoff 100 is compressed and decompressed over time.

Figure 2:
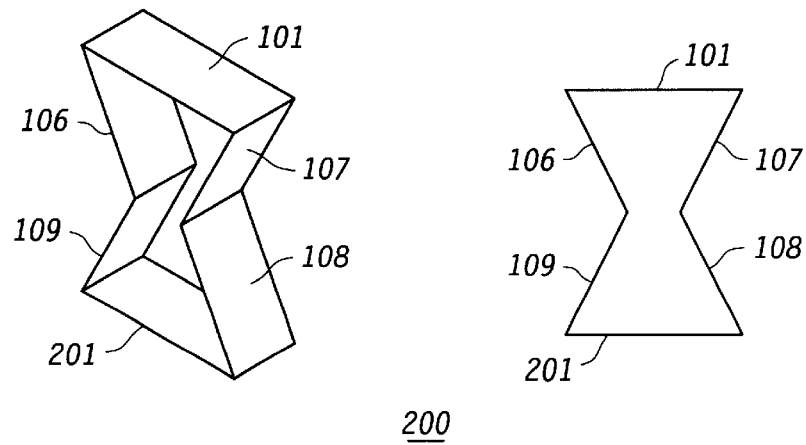
FIG. 2 illustrates perspective and side views of a compressible standoff in accordance with an alternative embodiment of the present invention.

FIG. 2 illustrates perspective and side views of a compression standoff 200 in accordance with an alternative embodiment of the present invention. The standoff 200 depicted in FIG. 2 is substantially identical to the standoff 100 depicted in FIG. 1, except that the bottom end portion 201 is a single element instead of including two subportions 103, 104 separated by a gap 111 as in FIG. 1. This embodiment of the standoff 200 may be fabricated using a known extrusion process to form a profile from which several standoffs 200 may be produced using conventional cutting or sawing techniques.

Figure 3:
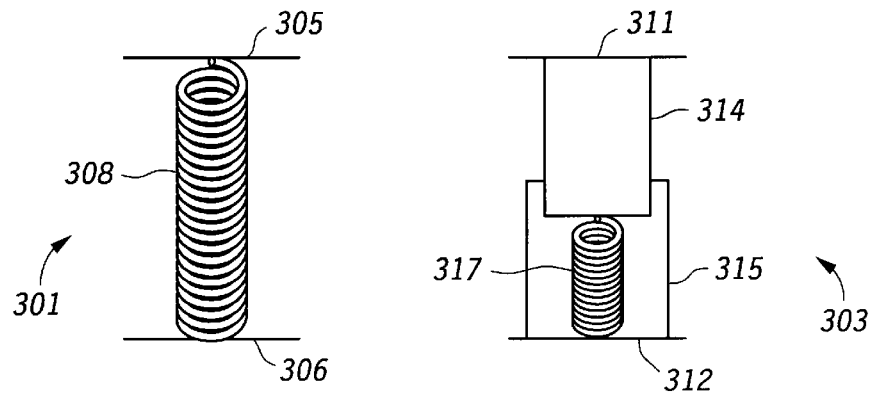
FIG. 3 illustrates side views of compressible standoffs in accordance with further alternative embodiments of the present invention.

FIG. 3 illustrates side views of two compression standoffs 301, 303 in accordance with further alternative embodiments of the present invention. The first alternative standoff 301 depicted in FIG. 3 incudes two end portions 305, 306 connected together by a compressible, spring body portion 308. The second alternative standoff 303 depicted in FIG. 3 also includes two end portions 311, 312 connected together by a compressible body portion, except that the compressible body portion in this embodiment includes two tubular members 314, 315 and a spring 317. The elasticity and thickness of the spring 308, 317 in each embodiment would be selected based on the amount of spring compression desired upon application of a compression force to one of the end portions 305, 311. The end portions 305, 306, 311, 312 of each embodiment are preferably substantially planar and are fabricated from a copper alloy or other solderable material to facilitate soldering of the standoffs 301, 303 to receptacle areas of a PC board and/or electrical components attached to a PC board.

Figure 4:
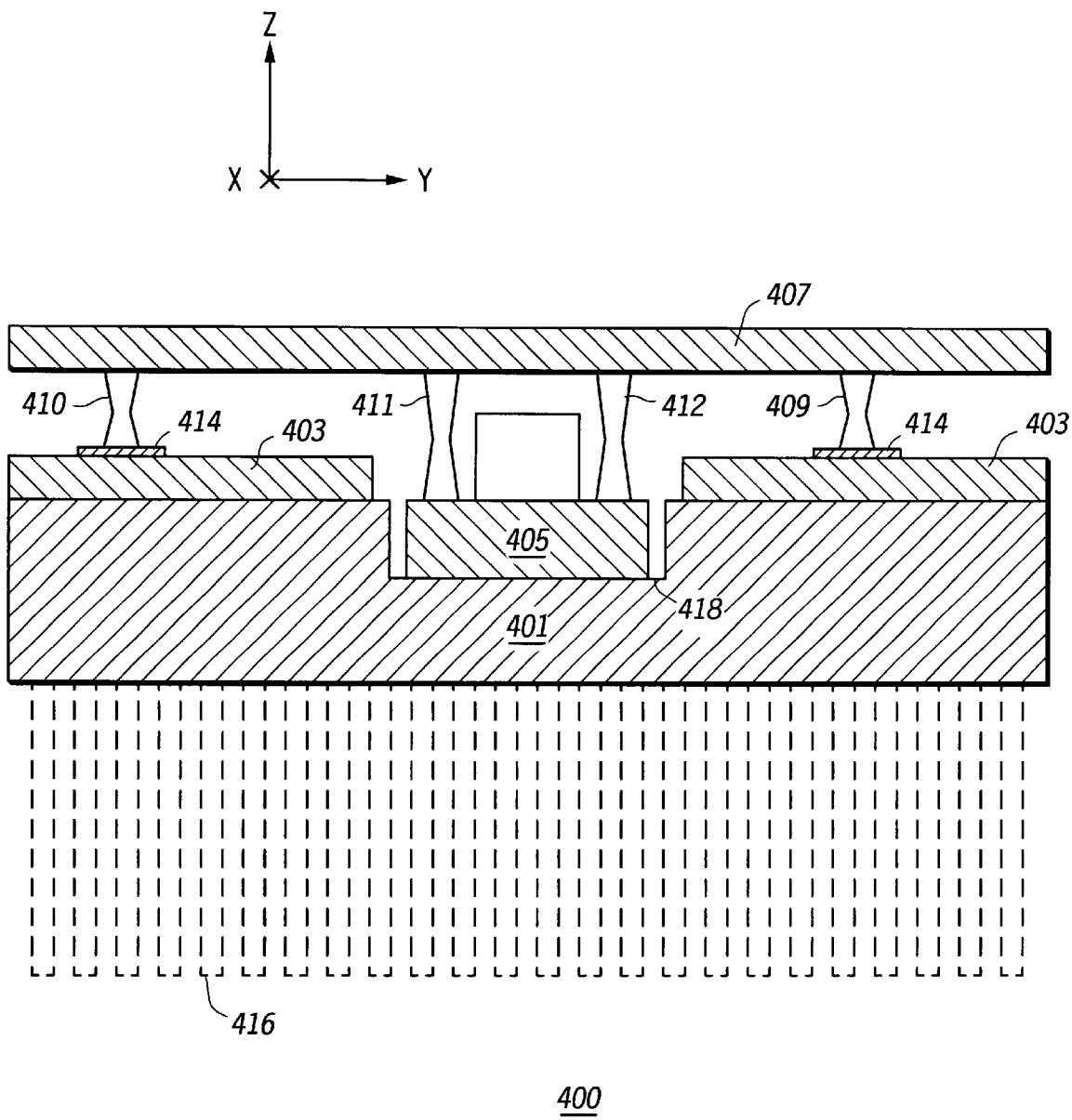
FIG. 4 is a cross-sectional view of a printed circuit board assembly in accordance with a preferred embodiment of the present invention.

FIG. 4 is a cross-sectional view of a PC board assembly 400 in accordance with a preferred embodiment of the present invention. The PC board assembly 400 includes a base plate 401, a PC board 403 positioned upon the base plate 401, one or more electrical components 405 (one shown) positioned upon the base plate 401 and attached (e.g., soldered) to the PC board 403, a cover 407, and multiple compressible standoffs 409–412. The base plate 401 is preferably fabricated from a metal, such as aluminum or copper, and forms part of a heat sink. The base plate 401 may optionally be coupled to a set of heat sink fins 416 as is known in the art to improve heat removal in high power dissipation applications. The PC board 403 may be fabricated from any presently known or later-developed PC board material. Exemplary PC board materials include cyanate ester, polyimide, alumina ceramic, polytetraflouroethylene (PTFE) or any form of bizmalemide triazine (BT) resin, such as the readily available FR4 resin. The PC board 403 may be a single layer PC board or a multi-layer PC board. Electrical component 405 may be any component that dissipates substantial heat during operation and, therefore, requires substantially direct connection to the base plate 401. For example, the electrical component 405 may be a radio frequency (RF) power transistor. Attachment of an electrical component, such as electrical component 405, to a PC board is described below with respect to FIG. 5. Various other electrical components (not shown) may be attached (e.g., soldered) to various locations of the PC board 403 in accordance with known techniques before the PC board 403 is positioned upon the top surface of the base plate 401.

The cover 407 is preferably constructed of a metal, such as aluminum or steel; however, any other substantially rigid material may be used. The cover 407 applies a compression force to the top portions of the standoffs 409–412 when the cover 407 is in a closed position. To insure application of an appropriate amount of compression force, the cover 407 may be prestressed in a direction of the base plate 401, such that, in an open position, the cover 407 includes a slightly convex curvature with respect to the base plate 401 and/or PC board 403, but in the closed position, the cover 407 is substantially flat. The cover 407 is also preferably electrically coupled to the base plate 401 to form a shielded enclosure. For example, the PC board assembly 400 may also include metallic walls (not shown) extending from the base plate 401 toward the cover 407 and the cover 407 may include extrusions about the cover's periphery extending toward the base plate 401. The electrical connection of the cover 407 to the base plate 401 may be accomplished by attaching the cover, or its extrusions, to the base plate 401 or the base plate walls using screws or some other means, such as a snap fitting mechanism. Alternatively, the cover 407 may pivotally engage the base plate 401 at one end and attach to the base plate 401 at an opposite end using a latching mechanism. Such an alternative embodiment is described in more detail below with respect to FIGS. 5–7.

The standoffs 409–412, which may be any one of the standoffs 100, 200, 301, 303 described above with respect to FIGS. 1–3, are positioned between the PC board 403 (and/or particular electrical components 405) and the cover 407 as shown. The standoffs 409–412 are positioned on receptacle areas 414 (e.g., 0.004–0.1 millimeter thick copper pads) of the PC board 403 and/or on one or more electrical components 405 to be attached to the PC board 403. With respect to positioning of the standoffs 411, 412 on the electrical components 405, the standoffs 411, 412 may be positioned on a flange of the component 405 (as depicted in FIG. 4) or may be positioned on a flange to which the component 405 is attached, in which case the external flange and the component 405 together form a single, composite component for purposes of the present invention. The aforementioned preferred positioning of the standoffs on predefined receptacle areas 414 of the PC board 403 (e.g., solder pads) applies only when the standoffs 409, 410 are going to be soldered to the receptacle areas 414. In cases in which the standoffs 409, 410 are going to be attached to the PC board 403 by other means, such as through the use of epoxy, predefined receptacle areas 414 may not be necessary.

The standoffs 409–412 are preferably positioned on the receptacle areas 414 using an automated pick-and-place machine during population of the PC board 403 with surface mountable electrical components. The positioned standoffs 409–412 are then preferably soldered or otherwise attached to the PC board 403 and/or any particular electrical components 405 substantially when the automatically-placed components (which may include component 405) are likewise soldered or otherwise attached to the PC board 403. For example, the standoffs 409–412 may be soldered to the PC board 403 during reflow or wave soldering process. With respect to positioning and attaching standoffs 411, 412 to electrical components 405, each standoff 411, 412 should be attached to a flange or other portion of the component 405 in such a manner that the standoff 411, 412 does not interfere with the component's operation. Standoffs 411 and 412 are depicted as being attached to the flange of electrical component 405. In addition, the heights of the standoffs 409–412 are preferably such that the standoffs 409–412 are at least two (2) to three (3) millimeters taller than the tallest components (e.g., walls of electrical shields) on the PC board 403 in order to allow the standoffs 409–412 to receive adequate compression force from the cover 407 and to prevent the cover from contacting such components. Further, as depicted in FIG. 4, the standoffs 409, 410 used to secure the PC board 403 to the base plate 401 may be of a different height or heights than the standoffs 411, 412 used to secure any electrical components 405.

The thickness of the base plate 401 varies depending on the particular application in which the PC board assembly 400 is being used. For example, the thickness of the base plate 401 will likely be greater in high power dissipation applications, such as when the PC board assembly 400 implements a power amplifier. In low power applications, the base plate 401 may be very thin (on the order of approximately two (2) millimeters); whereas, in high power applications the base plate may be very thick (on the order of approximately ten (10) millimeters). The base plate 410 may also include one or more recesses 418 to accommodate attachment of electrical components 405 to the base plate 401 such that leads or tabs of the components 405 align properly with receptacle areas (shown in FIG. 5) of the PC board 403.

Figure 7:
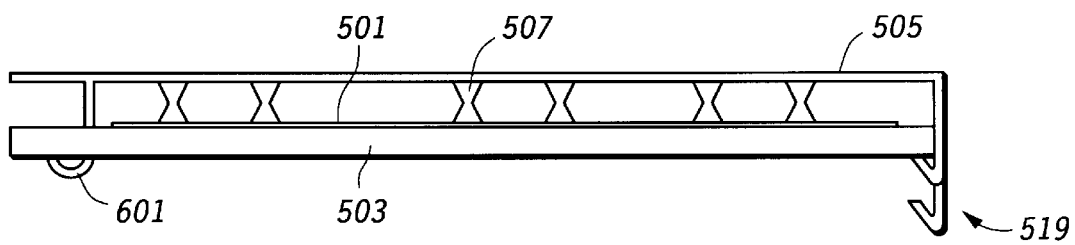
FIG. 7 is a side view of the printed circuit board assembly of FIG. 5 illustrating the application of a compression force by the cover when the cover is in a closed position in accordance with the present invention.

The thickness of the cover 407 will vary based on the attachment mechanism employed and the amount of compression force necessary to adequately secure the PC board 403 and/or any electrical components 405 to the base plate 401 for a particular application. For example, when a prestressed aluminum cover 407 is used to apply approximately sixty-eight (68) kilograms of force, and the cover 407 is attached to the base plate 401 using screws, the thickness of the cover 407 may be in the range of approximately one (1) to two (2) millimeters. On the other hand, when a latching mechanism as depicted in FIG. 7 is used to attach an unstressed aluminum cover 407 to the base plate 401 in order to apply a similar amount of compression force, the thickness of the cover 407 may be in the range of approximately two (2) to three (3) millimeters.

The thicknesses or heights of one or more of the base plate 401, the PC board 403, the cover 407, the flange of the electrical component 405, the standoffs 409–412, and the receptacle areas 414 have been exaggerated in FIG. 4 to illustrate the features of the present invention. Exemplary thicknesses of some of these elements 401–414 have been provided above to illustrate particular embodiments of the present invention.

An alumina-filled paraffin (not shown), such as "POWERSTATE" compound that is commercially available from Power Devices, Inc. of Newburyport, Mass., or another thermally conductive, compressible material may be used between the PC board 403 and/or the electrical component 405 and the base plate 401 to fill any air gaps that may exist between the PC board 403 and/or the electrical component 405 and the base plate 401 to further improve the transfer of heat away from the board 403 or component 405. Such air gaps are typically a result of tolerance variations in the flatness of the contact surface of the base plate 402 and the flatness of the contact surface of the flange of the electrical component 405 and/or the bottom side of the PC board 403.

When the cover 407 is closed, the cover 407 applies a compression force toward the base plate 401 and to the top portions of the standoffs 409–412. The standoffs 409–412 compress slightly (e.g., approximately one (1) to three (3) millimeters) toward the base plate 401 upon application of the compression force, and act as compression force distributors by distributing the compression force applied by the cover 407 to the PC board 403 and any electrical components 405 to which the standoffs 409–412 are attached. In a preferred embodiment, each compressible standoff 409–412 applies approximately twenty-five (25) pounds (approximately 11.4 kilograms) of compression force to the PC board 403 or an electrical component 405. The amount of compression force applied by each standoff 409–412 may be varied by varying the thickness of the standoff material (e.g., beryllium copper) or the width 112 of the standoff 409–412. In addition, multiple standoffs may be grouped side-by-side to increase the amount of compression force applied to particular areas of the PC board 403.

Since compressible standoffs 409–412 are used instead of screws to secure the PC board 403 and/or certain electrical components 405 to the base plate 401, the base plate 401 does not need to be machined with tapped screw holes to accommodate fastening of the board 403 and/or the components 405. Therefore, the present invention facilitates use of a common base plate/heat sink platform for various PC board-implemented electrical circuit designs. Further, the present invention renders the design of the electrical circuitry on the PC board 403 independent of the base plate tooling, particularly when no electrical components 405 are directly connected to the base plate 401 or when electrical components 405 that are directly connected to the base plate 401 do not require the use of recesses 418 in the base plate 401.

To minimize any negative impact on electrical components 405 to which the standoffs 411, 412 may be attached or on electrical components positioned on the PC board 403 near the standoffs 409, 410, the standoffs 409–412 preferably compress in only one direction (toward the base plate 401), without increasing in size in any other direction. Using the exemplary x, y, and z-coordinate system depicted in FIG. 4, the standoffs 409–412 preferably compress or decrease in length in the z-direction only when a compression force is applied, without increasing in size in the x or directions.

In one tested embodiment of the present invention in which (1) standoffs similar to those depicted in FIG. 1 were used to secure an RF power transistor to a heat sink base plate, (2) an alumina-filled paraffin was used to fill any air gaps between the flange of the transistor and the base plate, and (3) approximately six kilograms of compression force were applied to each standoff, thermal conductivity test results showed substantially equal thermal conductivity with the present invention as compared with the thermal conductivity resulting from securing the transistor to the base plate using two screws, each fastened with an electric torque driver set at twenty inch-pounds (approximately 0.230 meter-kilograms) of torque, and with no alumina-filled paraffin. Although the tested embodiment of the PC board assembly utilized an alumina-filled paraffin between the transistor flange and the base plate, use or non-use of such a paraffin material to fill air gaps between the base plate and electrical components or the PC board will be based on the particular application.

Figure 5:
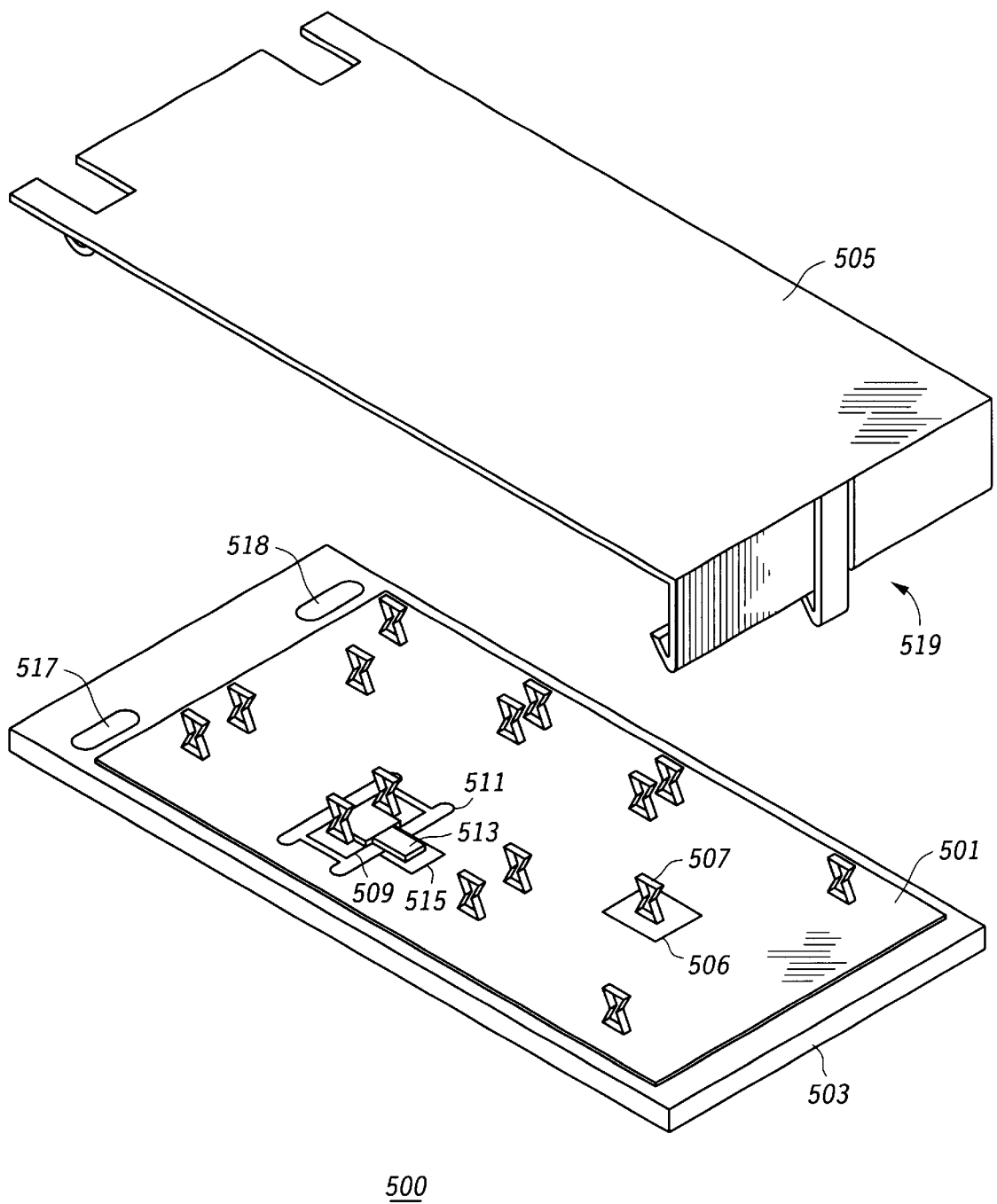
FIG. 5 is a perspective view of a printed circuit board assembly with the cover removed in accordance with an alternative embodiment of the present invention.

FIG. 5 is a perspective view of a PC board assembly 500 with the cover 505 removed in accordance with an alternative embodiment of the present invention. Similar to the PC board assembly 400 of FIG. 4, the PC board assembly 500 of FIG. 5 includes a PC board 501 positioned upon a base plate 503, a cover 505, a plurality of compressible standoffs 507 or other compression force distributors, and one or more optional electrical components 509 (one shown) positioned upon the base plate 503. The PC board 501 preferably includes metallic receptacle areas 506 upon which the standoffs 507 are placed during component population of the PC board 501. The standoffs 507 are preferably soldered to the receptacle areas 506 during the reflow or wave soldering process used to solder other components (not shown) to the PC board 501. The standoffs 507 may alternatively be attached to the PC board 501 with an epoxy or other adhesive.

The PC board 501 also includes one or more cutout areas 511 (one shown) to accommodate positioning and placement of certain electrical components 509 (e.g., RF power transistors) within the cutout areas 511, such that the components 509 rest upon the base plate 503. The components 509 positioned upon the base plate 503 include tabs or leads 513 (one shown) that are soldered or otherwise attached (e.g., using conductive epoxy) to corresponding PC board receptacle areas 515 (one shown) either contemporaneously with the soldering or attachment of other PC board components or some time thereafter. When electrical components, such as component 509, are included in the PC board assembly 500, standoffs 507 are preferably positioned upon one or more portions of each component 509 (e.g., on each end of the flange of an RF power transistor) and are used to secure the component 509 to the base plate 503 upon receipt of a compression force from a compression source, such as the cover 505. That is, the standoffs 507 are preferably placed at locations on the PC board 501 and on certain electrical components 509 where screws would ordinarily be used to secure the PC board 501 and the components 509 to the base plate 503.

Since special machining of the base plate 503 is not necessary when using compressible standoffs 507 or other compression force distributors in accordance with the present invention, many more standoffs 507 may be positioned on the PC board 501 than would be screws in the prior art to distribute the applied compression force as desired for a particular application of the PC board assembly 500. For example, in RF applications in which improper grounding can critically affect performance of the assembly 500, substantially more standoffs 507 may be used than screws as in the prior art in order to achieve a substantially continuous contact between a ground plane on the bottom side of the PC board 501 and the contact or top surface of the base plate 503. Except as described below, the materials and other characteristics of the PC board assembly components 501, 503, 505–507, and 509 are similar to corresponding components described above with respect to the PC board assembly 400 of FIG. 4.

The base plate 503 in this embodiment includes two slots 517, 518 to accommodate insertion of a pivoting mechanism forming part of the cover 505. The pivoting mechanism is depicted more clearly in FIGS. 6 and 7 and is described below. The cover 505 also includes a latching mechanism 519 that enables the cover 505 to attach to the bottom surface of the base plate 503 when the cover 505 is in a closed position. The compression force is applied by the cover 505 as the cover 505 engages the top portions of the standoffs 507 and compresses the body portions of the standoffs 507 toward the base plate 503 until the latching mechanism attaches the cover 505 to the base plate 503. The compression force remains substantially constant while the cover 505 is closed due to the latching mechanism.

Figure 6:
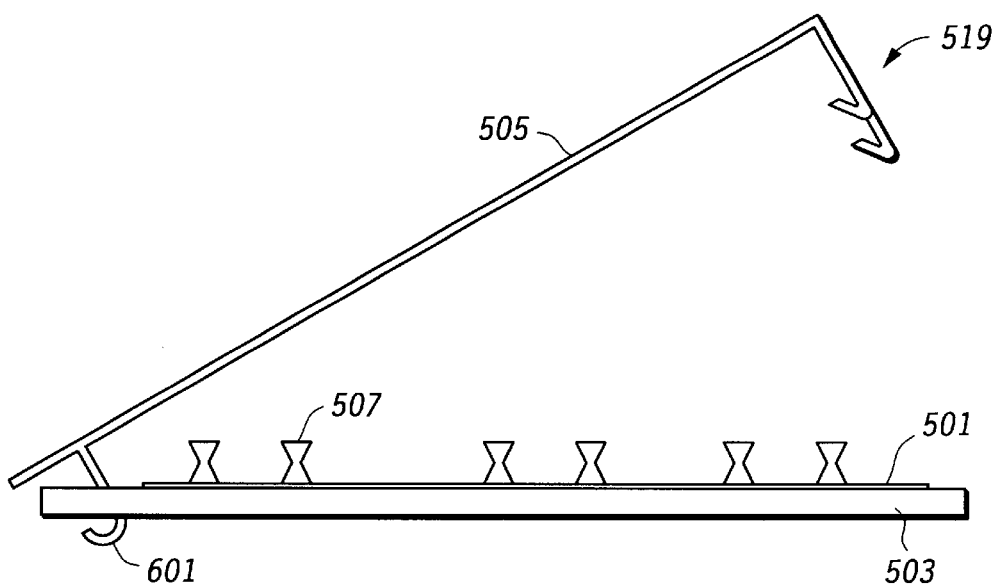
FIG. 6 is a side view of the printed circuit board assembly of FIG. 5 illustrating pivotal attachment of the cover to the base plate in accordance with the present invention.

FIG. 6 is a side view of the PC board assembly 500 of FIG. 5 illustrating pivotal attachment of one end of the cover 505 to the base plate 503 in accordance with the present invention. As depicted, a pivoting mechanism (hooks 601) of the cover 505 is positioned through the slots 517, 518 of the base plate 503, such that the pivoting mechanism allows the cover 505 to rotate with respect to a pivot axis. In the embodiment depicted in FIG. 6, counterclockwise rotation of the cover 505 about the pivot axis opens the cover 505; whereas, clockwise rotation closes the cover 505. Of course, the base plate slots 517, 518 and cover pivoting mechanism may be arranged such that clockwise rotation of the cover 505 about the pivot axis opens the cover 505; whereas, counterclockwise rotation closes the cover 505.

When the cover 505 is closed, as depicted in FIG. 7, the cover 505 applies a compression force to the standoffs 507, which in turn transfer the applied force to the PC board 503 and/or particular electrical components 509 as described above. The latching mechanism 519 engages the bottom surface of the base plate 503 to keep the cover 505 in the closed position. Release of the latching mechanism 519 and rotation of the cover 505 opens the cover 505 and removes the compression force. The cover 505 may be prestressed in the direction of the base plate 503 as discussed above with respect to FIG. 4 depending on the amount of compression force necessary to secure the PC board 501 and/or any electrical components 509 to the base plate 503 when the cover 505 is closed. When the cover 505 is closed and the compression force is applied, the standoffs 507 act as compression force distributors by distributing the compression force applied by the cover 505 to the PC board 501 and any electrical components 509 to which the standoffs 507 are attached. Thus, in the completed assembly 500, the standoffs 507 are positioned between the cover 505 (compression source) and the PC board 501 and/or any electrical components 509 that are to be secured to the base plate 501.

Figure 8:
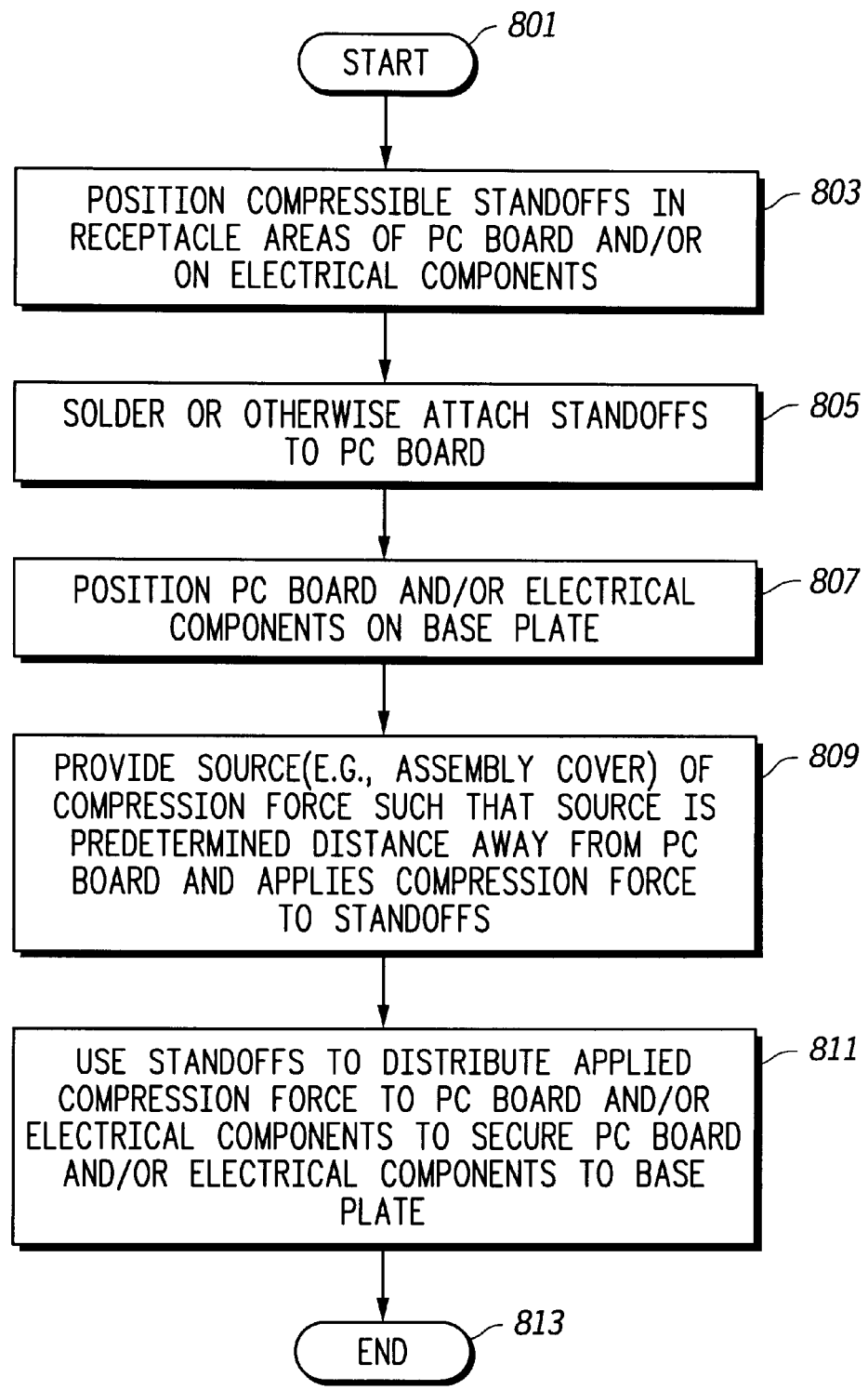
FIG. 8 is a logic flow diagram of steps executed to secure a printed circuit board and/or one or more electrical components to a base plate in accordance with the present invention.

FIG. 8 is a logic flow diagram 800 of steps executed to secure a PC board and/or one or more electrical components to a base plate in accordance with a preferred embodiment of the present invention. The logic flow begins (801) when compressible standoffs, such as those described above with respect to FIGS. 1–3, or any other comparable compression force distributors are positioned (803) in receptacle areas of the PC board and/or on receptacle areas of electrical components. In the preferred embodiment, the standoffs are automatically positioned in their respective receptacle areas by an automated pick-and-place machine during the time period that the pick-and-place machine is positioning other electrical components on the PC board. Each standoff is preferably fabricated from a length of a copper alloy and is formed as described above with respect to FIG. 1. The standoffs are preferably packaged in a tape and reel to be used by the pick-and-place machine.

After the compressible standoffs or other comparable compression force distributors are positioned on the PC board and/or the electrical components, the standoffs are soldered or otherwise attached (805), such as through use of an epoxy (e.g., a conductive epoxy), to their respective receptacle areas (e.g., copper solder pads) on the PC board and/or the components. The standoffs are preferably soldered to the PC board contemporaneously with the soldering or attachment of other surface mount PC board components. After the standoffs have been soldered or otherwise attached to the PC board and/or the electrical components, the PC board and the electrical components (if any) are positioned (807) upon the base plate (e.g., of a heat sink). A source of a compression force is then provided (809), such that the source is a predetermined distance (e.g., slightly less than the height of the standoffs) away from the PC board and applies the compression force to the standoffs or comparable compression force distributors. The compression source is preferably a cover of the PC board assembly that includes the PC board and the base plate. In one embodiment, the cover may be pivotally attached to the base plate and include a latching mechanism substantially as described above with respect to FIGS. 5–7. The cover supplies the compression force to the standoffs or other compression force distributors when the cover is in a closed position.

Once the compression force has been applied to the standoffs or other compression force distributors, the standoffs are used (811) to distribute the applied compression force to the PC board and/or the electrical components to which the standoffs are attached and, thereby, secure the PC board and/or the electrical components to the base plate, ending (813) the logic flow. That is, the standoffs or other comparable compression force distributors preferably transfer the compression force applied to their top portions, through their compressible bodies, to their bottom portions and to the PC board or electrical components attached thereto. In the preferred embodiment, the standoffs compress, under application of the compression force, only in the direction of the PC board and the base plate, but not in any other direction to minimize any negative impact on the operation of the PC board assembly.

The present invention encompasses an apparatus and method for securing a PC board and/or electrical components to a base plate. With this invention, a PC board and/or electrical components may be properly secured to a base plate without using screws or other conventional fastening mechanisms that require specialized base plate or heat sink tooling, thereby supporting common base plate or heat sink platforms for various PC board electrical designs. In addition, part of the securing mechanism (i.e., the compressible standoffs or other compression force distributors) may be surface-mountable and, therefore, capable of being automatically positioned on the PC board by an automated pick-and-place machine. Prior art securing mechanisms do not include any auto-placeable components. Further, since the standoffs can be automatically placed, they are not subject to the human errors typically encountered when screws are used as the securing means. In the foregoing specification, the present invention has been described with reference to specific embodiments. However, one of ordinary skill in the art will appreciate that various modifications and changes may be made without departing from the spirit and scope of the present invention as set forth in the appended claims. For example, compression force distributors other than the compressible standoffs described above with respect to FIGS. 1–3 may be developed and used by one of ordinary skill in the art. In addition, although the benefits of the present invention have been presented above primarily with respect to a PC board assembly used in a high power dissipation application, the present invention is also applicable in low and medium power applications to help automate the PC board securing process. Accordingly, the specification and drawings are to be regarded in an illustrative rather than a restrictive sense, and all such modifications are intended to be included within the scope of the present invention.

Benefits, other advantages, and solutions to problems have been described above with regard to specific embodiments of the present invention. However, the benefits, advantages, solutions to problems, and any element(s) that may cause or result in such benefits, advantages, or solutions, or cause such benefits, advantages, or solutions to become more pronounced are not to be construed as a critical, required, or essential feature or element of any or all the claims. As used herein and in the appended claims, the term "comprises," "comprising," or any other variation thereof is intended to refer to a non-exclusive inclusion, such that a process, method, article of manufacture, or apparatus that comprises a list of elements does not include only those elements in the list, but may include other elements not expressly listed or inherent to such process, method, article of manufacture, or apparatus.

What is claimed is:

1. An apparatus for use in securing at least one of a printed circuit board and an electrical component to a base plate, the apparatus comprising:
   a first end portion that includes a substantially planar outer surface, the substantially planar outer surface of the first end portion being contactable by a source of a compression force;
   a second end portion that includes a substantially planar outer surface, the substantially planar outer surface of the second end portion being contactable by the at least one of the printed circuit board and the electrical component; and
   a compressible body portion connecting the first end portion to the second end portion, the compressible body portion transferring the compression force applied to the first end portion to the second end portion for application to the at least one of the printed circuit board and the electrical component, wherein the compressible body portion compresses in one direction without increasing in size in any other direction.

2. The apparatus of claim 1, wherein the second end portion comprises a solderable material and is soldered to the at least one of the printed circuit board and the electrical component substantially when one of the electrical component and at least one other electrical component is soldered to the printed circuit board.

3. The apparatus of claim 2, wherein the second end portion includes two subportions separated by a gap and wherein solder fills the gap when the second end portion is soldered to the at least one of the printed circuit board and the electrical component.

4. The apparatus of claim 2, wherein the solderable material is a copper alloy.

5. The apparatus of claim 4, wherein the copper alloy is beryllium copper.

6. The apparatus of claim 1, wherein the compressible body portion comprises:
   a first angled member having a first end and a second end, the first end of the first angled member being connected to a first end of the first end portion, the first angled member forming an acute angle with the first end portion;
   a second angled member having a first end and a second end, the first end of the second angled member being connected to a second end of the first end portion, the second angled member forming an acute angle with the first end portion;
   a third angled member having a first end and a second end, the first end of the third angled member being connected to the second end of the first angled member, the second end of the third angled member being connected to a first end of the second end portion, and the third angled member forming an acute angle with the second end portion; and
   a fourth angled member having a first end and a second end, the first end of the fourth angled member being connected to the second end of the second angled member, the second end of the fourth angled member being connected to a second end of the second end portion, and the fourth angled member forming an acute angle with the second end portion.

7. The apparatus of claim 1, wherein the compressible body portion includes a spring.

8. The apparatus of claim 1, wherein a surface area of the substantially planar outer surface of the first end portion is sufficient to facilitate automated pick-and-placement of the apparatus on the printed circuit board.

9. The apparatus of claim 1, wherein the first end portion, the second end portion and the body portion form an integrated device.

10. A printed circuit board assembly comprising:
    a base plate;
    a printed circuit board positioned upon the base plate;
    a cover that applies a compression force toward the base plate when the cover is in a closed position; and
    a plurality of compressible standoffs positioned between the cover and the printed circuit board, the plurality of compressible standoffs transferring the compression force applied by the cover to the printed circuit board such that the printed circuit board is secured to the base plate, each of the plurality of compressible standoffs compressing in one direction without increasing in size in any other direction.

11. The printed circuit board assembly of claim 10, wherein the printed circuit board includes at least one cutout area, the printed circuit board assembly further comprising:
    at least one electrical component positioned within the at least one cutout area of the printed circuit board such that the at least one electrical component rests upon the base plate;
    wherein at least one of the plurality of compressible standoffs is positioned between the cover and the at least one electrical component such that the at least one electrical component is secured to the base plate.

12. The printed circuit board assembly of claim 11, wherein the cover is pivotally attached to the base plate and includes a latching mechanism to enable the cover to attach to the base plate when the cover is in the closed position.

13. The printed circuit board assembly of claim 12, wherein the base plate forms part of a heat sink.

14. The printed circuit board assembly of claim 10, wherein each of the plurality of compressible standoffs comprises:
    a first end portion that includes a substantially planar outer surface, the substantially planar outer surface of the first end portion being contactable by the cover;
    a second end portion that includes a substantially planar outer surface, the substantially planar outer surface of the second end portion being contactable by the printed circuit board; and
    a compressible body portion connecting the first end portion to the second end portion, the compressible body portion transferring the compression force applied to the first end portion by the cover to the second end portion for application to the printed circuit board, wherein the compressible body portion compresses in one direction without increasing in size in any other direction.

15. The printed circuit board assembly of claim 14, wherein at least the substantially planar outer surface of the second end portion is soldered to a receptacle area of the printed circuit board.

16. The printed circuit board assembly of claim 10, wherein the cover is prestressed in a direction of the base plate in order to supply the compression force.

17. A printed circuit board assembly comprising:
   a base plate;
   a printed circuit board positioned upon the base plate, the printed circuit board including at least one cutout area;
   at least one electrical component positioned within the at least one cutout area of the printed circuit board such that the at least one electrical component rests upon the base plate;
   a cover that applies a compression force toward the base plate when the cover is in a closed position; and
   a plurality of compressible standoffs positioned between the cover and the printed circuit board and between the cover and the at least one electrical component, the plurality of compressible standoffs transferring the compression force applied by the cover to the printed circuit board and the at least one electrical component such that the printed circuit board and the at least one electrical component are secured to the base plate, each of the plurality of compressible standoffs compressing in one direction without increasing in size in any other direction.

18. The printed circuit board assembly of claim 17, wherein each of the plurality of compressible standoffs comprises:
   a first end portion that includes a substantially planar outer surface, the substantially planar outer surface of the first end portion being contactable by the cover;
   a second end portion that includes a substantially planar outer surface, the substantially planar outer surface of the second end portion being contactable by one of the printed circuit board and the at least one electrical component; and
   a compressible body portion connecting the first end portion to the second end portion, the compressible body portion transferring the compression force applied to the first end portion by the cover to the second end portion for application to one of the printed circuit board and the at least one electrical component, wherein the compressible body portion compresses in one direction without increasing in size in any other direction.

19. The printed circuit board assembly of claim 17, wherein the cover is pre-stressed in a direction of the base plate in order to supply the compression force.

20. A method for securing a printed circuit board to a base plate, the method comprising the steps of:
   providing a cover that applies a compression force toward the base plate when the cover is in a closed position;
   positioning a plurality of compressible standoffs between the cover and the printed circuit board; and
   using the plurality of compressible standoffs to transfer the compression force applied by the cover to the printed circuit board such that the printed circuit board is secured to the base plate, wherein each of the plurality of compressible standoffs compresses in one direction without increasing in size in any other direction.

21. The method of claim 20, wherein the step of providing comprises the step of providing a cover that is pivotally attached to the base plate and includes a latching mechanism, wherein the cover supplies the compression force when the cover is pivoted into a closed position and latched to the base plate.

22. The method of claim 20, further comprising the step of:
   using at least some of the plurality of compressible standoffs to distribute the compression force to at least one electrical component attached to the printed circuit board to thereby secure the at least one electrical component to the base plate.

* * * * *